United States Patent
Lu

(10) Patent No.: US 10,154,619 B2
(45) Date of Patent: Dec. 11, 2018

(54) CASE FOR FIXING CIRCUIT BOARD AND POWER SUPPLY

(71) Applicant: 3Y POWER TECHNOLOGY (TAIWAN), INC., Taoyuan (TW)

(72) Inventor: Shao-Feng Lu, Taoyuan (TW)

(73) Assignee: 3Y POWER TECHNOLOGY (TAIWAN), INC., Taoyuan (TW)

(*) Notice: Subject to any disclaimer, the term of this patent is extended or adjusted under 35 U.S.C. 154(b) by 0 days.

(21) Appl. No.: 15/690,292

(22) Filed: Aug. 30, 2017

(65) Prior Publication Data
US 2018/0103563 A1 Apr. 12, 2018

(30) Foreign Application Priority Data
Oct. 8, 2016 (CN) .................. 2016 2 1102796 U

(51) Int. Cl.
- *H05K 9/00* (2006.01)
- *H05K 5/02* (2006.01)
- *H05K 7/14* (2006.01)
- *G06F 1/18* (2006.01)

(52) U.S. Cl.
CPC ............ *H05K 9/0032* (2013.01); *G06F 1/18* (2013.01); *H05K 5/0217* (2013.01); *H05K 7/1417* (2013.01); *H05K 7/1492* (2013.01)

(58) Field of Classification Search
CPC .. H05K 9/0032; H05K 5/0217; H05K 7/1417; H05K 7/142; H05K 7/1404; H05K 7/1405; H05K 7/1492; G06F 1/18
See application file for complete search history.

(56) References Cited

U.S. PATENT DOCUMENTS

| | | | |
|---|---|---|---|
| 6,288,902 B1* | 9/2001 | Kim ...................... | G11B 33/08 206/701 |
| 6,337,795 B1* | 1/2002 | Wang ................. | H05K 7/20172 361/695 |
| 6,768,648 B2* | 7/2004 | Kobayashi ............. | H05K 7/142 174/138 E |
| 7,040,905 B1* | 5/2006 | Wang ................... | H05K 7/1404 361/759 |
| 2005/0018388 A1* | 1/2005 | Shih ....................... | G06F 1/181 361/679.02 |
| 2007/0053109 A1* | 3/2007 | Hayakawa ............. | G11B 33/02 360/245.9 |
| 2013/0033818 A1* | 2/2013 | Hosoda .............. | H05K 7/20927 361/688 |

(Continued)

*Primary Examiner* — Dimary S Lopez Cruz
*Assistant Examiner* — Abhishek M Rathod
(74) *Attorney, Agent, or Firm* — JCIPRNET

(57) ABSTRACT

The invention provides a case for fixing a circuit board, including a plate body and an edge-bent component. The edge-bent component includes a first bent plate and a second bent plate respectively formed by extending and bending a side plate of the plate body inward. A fixing region that fits a thickness of the circuit board and fixes the circuit board in a first direction is formed between the first bent plate and the second bent plate. According to the invention, the circuit board is fixed by the bent plates formed by bending the case inward. The invention further provides a power supply, including the case for fixing the circuit board, the circuit board, and a circuit component. The circuit board is mounted in the fixing region to restrict movement of the circuit board in the first direction.

12 Claims, 6 Drawing Sheets

(56) References Cited

U.S. PATENT DOCUMENTS

| | | | |
|---|---|---|---|
| 2013/0100622 A1* | 4/2013 | Wang | H05K 7/142 361/759 |
| 2013/0120945 A1* | 5/2013 | Zhao | H05K 7/142 361/759 |
| 2014/0146492 A1* | 5/2014 | Tang | H05K 7/1492 361/752 |
| 2015/0189766 A1* | 7/2015 | Fan | G06F 1/18 312/223.2 |
| 2016/0234957 A1* | 8/2016 | Huang | H05K 7/1417 |

* cited by examiner

CASE FOR FIXING CIRCUIT BOARD AND POWER SUPPLY

CROSS-REFERENCE TO RELATED APPLICATION

This application claims the priority benefit of Chinese application serial no. 201621102796.2, filed on Oct. 8, 2016. The entirety of the above-mentioned patent application is hereby incorporated by reference herein and made a part of this specification.

BACKGROUND OF THE INVENTION

Field of the Invention

The invention relates to fixing of a circuit board and more particularly relates to a case for fixing a circuit board.

Description of Related Art

The main circuit board of the general power supply is disposed at the bottom of a case to facilitate disposing circuit components on the main circuit board, and the main circuit board is provided with holes so as to be secured onto a base of the case by screws to be fixed to the case, thereby preventing an external force applied on the power supply from damaging the circuit components and causing malfunction of the power supply. However, as the products are miniaturized, using screws for fixing may have the following drawbacks: 1. A creepage distance (insulation distance) is required between the screws and other components on the main circuit board to prevent short circuit arc, spark discharge, and so on, but the creepage distance will take up the circuit wiring space on the main circuit board. The creepage distance will also increase the area of the main circuit board and inevitably increase the size of the power supply, so the products cannot be miniaturized. 2. Screw mounting takes more manpower and time and complicates the assembly.

In view of the above, a new structure for fixing circuit boards is urgently needed.

SUMMARY OF THE INVENTION

The invention provides a case for fixing a circuit board and a power supply corresponding thereto, in which the circuit board is fixed by bent plates that are formed by bending a plate body inward so as to reduce use of screws, effectively lower production costs, facilitate assembly, reduce the product size, and increase a circuit wiring space of the circuit board.

In view of the above, a case for fixing a circuit board is provided, which includes a plate body and an edge-bent component. The edge-bent component includes a first bent plate and a second bent plate that are respectively formed by extending and bending a side plate of the plate body inward. A fixing region that fits a thickness of the circuit board and fixes the circuit board in a first direction is formed between the first bent plate and the second bent plate.

According to the invention, the circuit board is fixed by the bent plates formed by bending the case inward. Thus, in comparison with the existing techniques, the invention reduces use of screws, effectively lowers production costs, and facilitates the assembly. Moreover, since the screws used on the circuit board are reduced, it is not required to dispose a creepage distance between the screws and the circuit to prevent short circuit arc, spark discharge, and so on. Consequently, the product size is reduced and the circuit wiring space of the circuit board is saved.

Preferably, the first bent plate and the second bent plate have a predetermined interval in the first direction so as to form the fixing region between the first bent plate and the second bent plate.

Specifically, a distance between the upper bent plate and the lower bent plate in the first direction is slightly larger than the thickness of the circuit board so as to loosely dispose the circuit board in the fixing region to facilitate assembly.

Specifically, the first bent plate and the second bent plate are arranged opposite to each other at the predetermined interval in the first direction. Of course, the first bent plate and the second bent plate may also be misaligned at a fixed interval in the first direction.

More specifically, a lateral side of the first bent plate and a lateral side of the second bent plate face each other, or a plate body of the first bent plate and a plate body of the second bent plate face each other or are perpendicular to each other.

Specifically, the first bent plate and the second bent plate are misaligned in a second direction perpendicular to the first direction.

Preferably, the edge-bent component is respectively disposed at four corners of the plate body so as to fix four corners of the circuit board in the edge-bent components at the four corners of the plate body. Thus, according to the invention, the plate body does not require a screw to fix the circuit board.

Preferably, the edge-bent component is respectively disposed at adjacent two corners of four corners of the plate body, and screw holes for fixing the circuit board are respectively formed at positions on the plate body that are diagonal to the edge-bent components. Thus, according to the invention, the circuit board is fixed with use of the bent plates and screws, which is more flexible for fixing and reduces the number of the screws used and the circuit wiring space of the circuit board.

Preferably, the edge-bent component is disposed at a corner of the plate body, and a screw hole for fixing the circuit board is formed at a position on the plate body that is diagonal to the edge-bent component. Preferably, the plate body includes an upper plate body, a lower plate body, a first side plate, and a second side plate, wherein the first side plate and the second side plate are opposite to each other, a stopper piece is disposed on the lower plate body, and is formed by extending and bending the lower plate body inward so as to divide the case into a front part and a rear part. The stopper piece not only prevents the circuit board from moving in the second direction but also divides the plate body into two parts along the second direction. The second direction and the first direction are perpendicular to each other.

The invention further provides a power supply, which includes a case, a circuit board mounted in the case, and a circuit component mounted on the circuit board. The case is as described above, and the circuit board is mounted in the fixing region to restrict movement of the circuit board in the first direction.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In order to explain the technical contents, structural features, objectives and effects of the invention more clearly, exemplary embodiments are described in detail hereinafter with reference to the figures.

Figure 1:
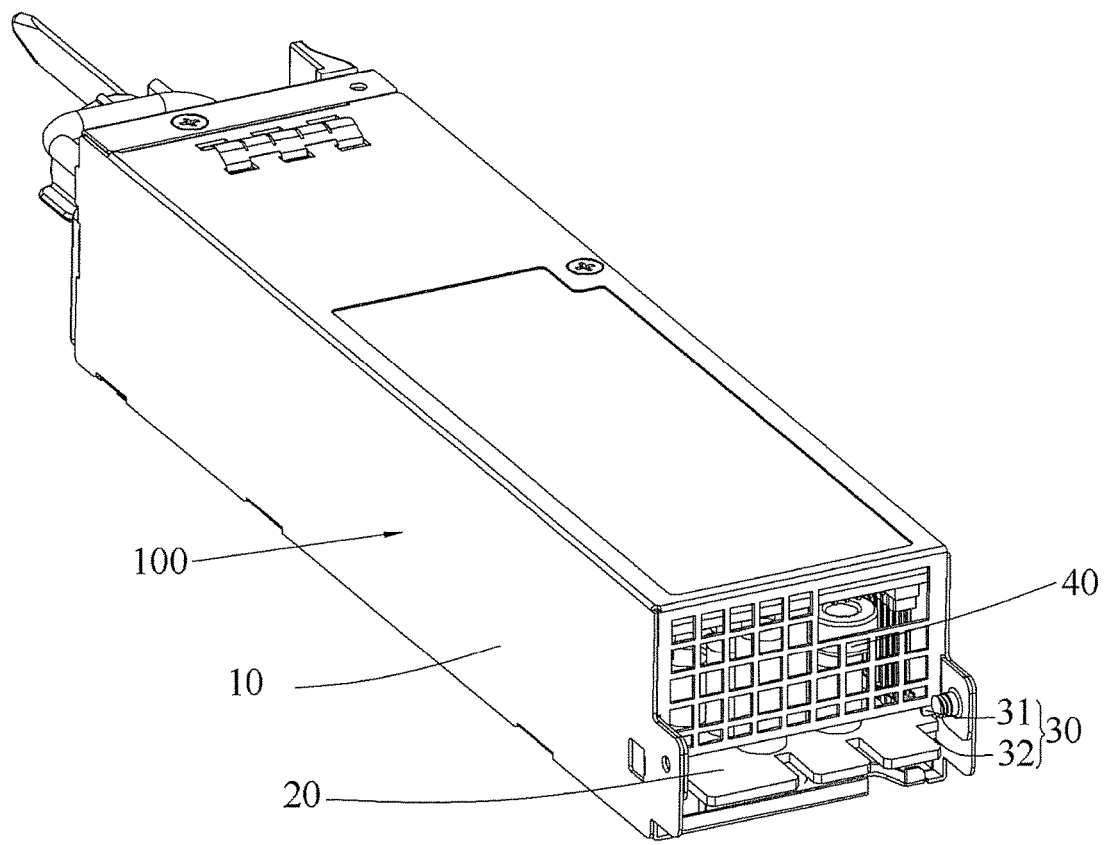
FIG. 1 is a perspective view of the power supply according to the invention.

Referring to FIG. 1, a power supply 200 is provided, which includes a case 100, a circuit board 20 mounted in the case 100, and a circuit component 40 mounted on the circuit board 20. The circuit board 20 is mounted on the case 100 by an edge-bent component 30. The edge-bent component 30 may restrict movement of the circuit board 20 in a first direction. The power supply 200 of the invention is not limited to a computer power supply, a server power supply, or a redundant power supply.

Figure 2:
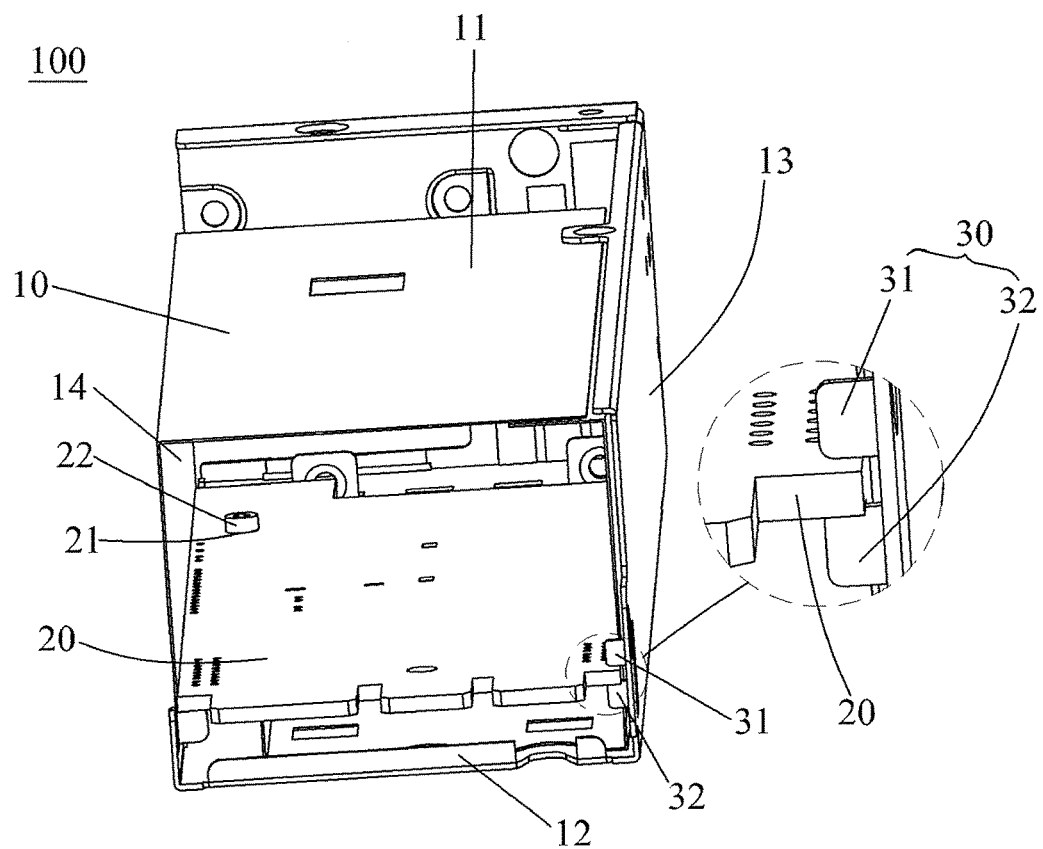
FIG. 2 is a view of the connection structure between the case and the circuit board in the first embodiment of the invention.
Figure 3:
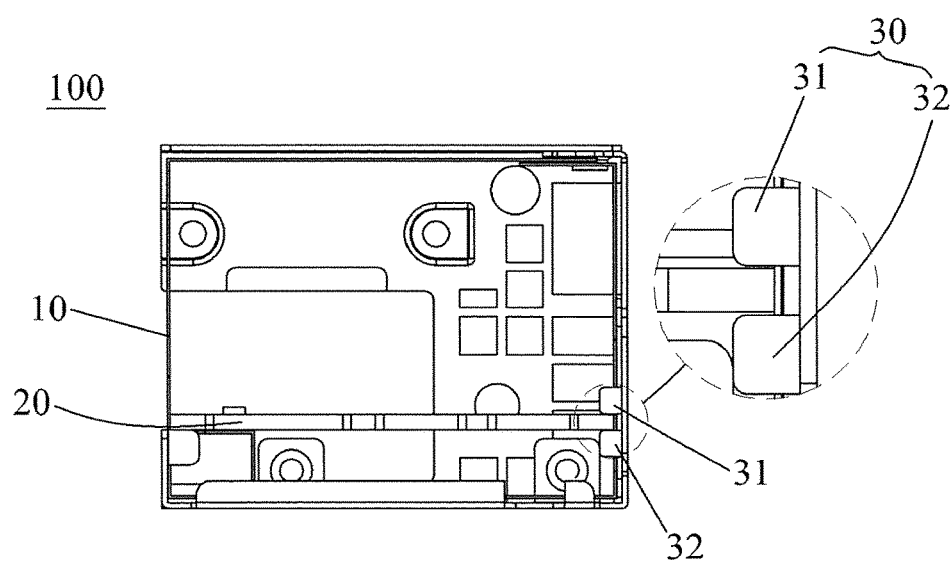
FIG. 3 is a view of the connection structure between the case and the circuit board from another perspective in the first embodiment of the invention.

Referring to FIG. 2 and FIG. 3, the case 100 includes a plate body 10 and the edge-bent component 30. The edge-bent component 30 includes a first bent plate 31 and a second bent plate 32 that are respectively formed by extending and bending a side plate of the plate body 10 inward. A fixing region, which fits a thickness of the circuit board 20 and fixes the circuit board 20 in the first direction, is formed between the first bent plate 31 and the second bent plate 32. According to the invention, the circuit board 20 is fixed by the edge-bent component 30 that is formed by bending the case 100 inward, so as to reduce use of screws and eliminate the need of welding an additional fixture to the side plate to effectively lower production costs and facilitate assembly. Moreover, since screw holes on the circuit board 20 are reduced, a creepage distance is not required on the circuit board 20, and thus the product size is reduced and a circuit layout space on the circuit board 20 is saved.

Preferably, in the first embodiment, the first bent plate 31 and the second bent plate 32 are arranged opposite to each other and have a predetermined interval in the first direction. A lateral side of the first bent plate 31 and a lateral side of the second bent plate 32 face each other, such that the fixing region is formed between the first bent plate 31 and the second bent plate 32. Of course, the first bent plate 31b and the second bent plate 32 may also be arranged with plate bodies facing each other.

The predetermined interval between the first bent plate 31 and the second bent plate 32 in the first direction is slightly larger than the thickness of the circuit board 20, so as to loosely dispose the circuit board 20 in the fixing region to facilitate assembly. Of course, the predetermined interval between the first bent plate 31 and the second bent plate 32 in the first direction may also be equal to the thickness of the circuit board 20. In that case, the circuit board 20 may be tightly or loosely fitted to the fixing region.

Referring to FIG. 2, the plate body 10 includes an upper plate body 11, a lower plate body 12, a first side plate 13, and a second side plate 14, wherein the first side plate 13 and the second side plate 14 are opposite to each other. The edge-bent component 30 is disposed at a front end of the first side plate 13, and a screw hole for fixing the circuit board 20 is disposed at a rear end position of the lower plate body 12 near the second side plate 14. A mounting hole 21 corresponding to the screw hole is formed on the circuit board 20. A screw 22 is disposed through the mounting hole 21 and fitted to the screw hole to fix the circuit board 20 onto the case 100. By disposing the edge-bent component 30 at the front end of the first side plate 13 and forming the screw hole for fixing the circuit board 20 at the rear end position near the second side plate 14, movement of the circuit board 20 in the first direction and a second direction (perpendicular to the first direction) is restricted effectively.

Of course, in another embodiment, the edge-bent component 30 may also be disposed respectively at the front and rear ends of the first side plate 13 while the screw hole for fixing the circuit board 20 is formed at a position of the lower plate body 12 near the second side plate 14. Of course, the edge-bent component 30 may also be disposed at any adjacent two corners of the case 100. In that case, the screw hole for fixing the circuit board 20 is formed at a position of the plate body 10 to be diagonal to the edge-bent component 30. Of course, the edge-bent component 30 may also be disposed respectively at four corners of the plate body 10, and four corners of the circuit board 20 are correspondingly mounted in the edge-bent components 30 at the four corners of the plate body 10 respectively, so as to eliminate the need of fixing the circuit board 20 with screws. In other words, the circuit board 20 does not require a creepage distance due to the screws. Since the space for disposing the creepage distance on the circuit board 20 is saved, the product size is reduced and the circuit wiring space on the circuit board 20 is saved.

Figure 4:
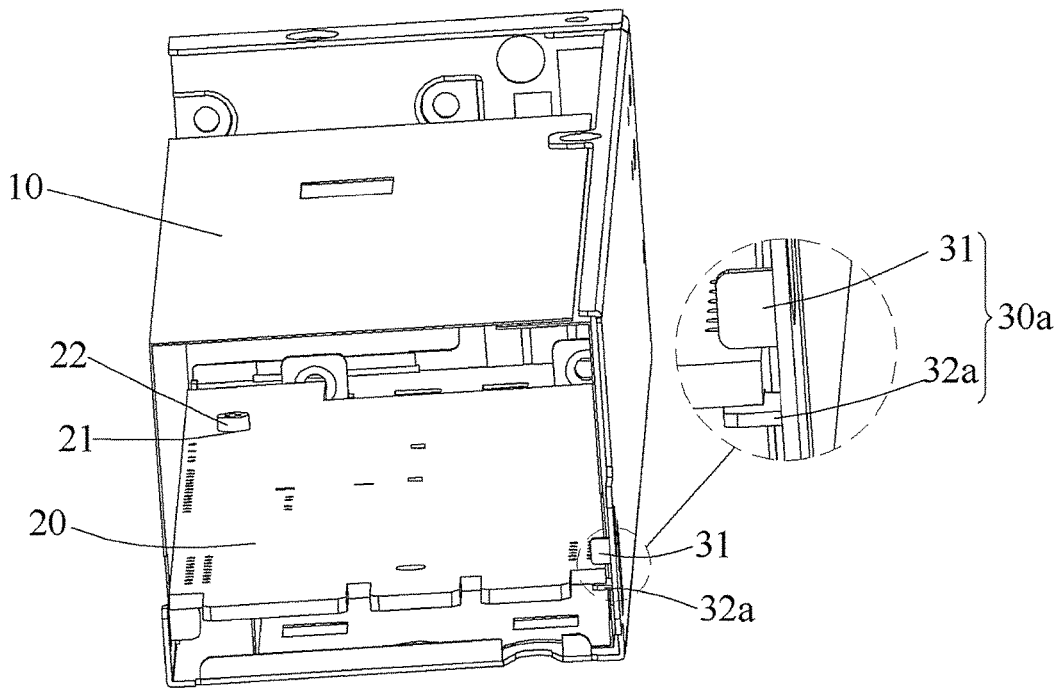
FIG. 4 is a view of the connection structure between the case and the circuit board in the second embodiment of the invention.
Figure 5:
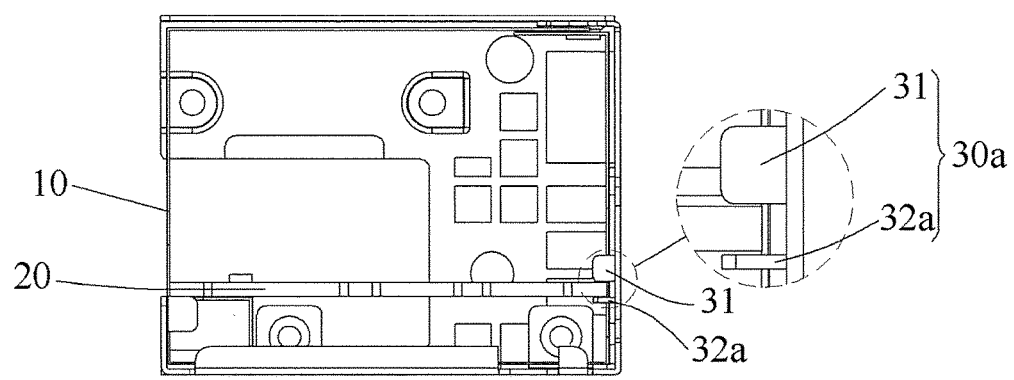
FIG. 5 is a view of the connection structure between the case and the circuit board from another perspective in the second embodiment of the invention.

Referring to FIG. 4 and FIG. 5, which illustrate the second embodiment of the invention, a difference between the second embodiment and the first embodiment is that, in the second embodiment, an edge-bent component 30a includes the first bent plate 31 and a second bent plate 32a. The first bent plate 31 and the second bent plate 32a are arranged opposite to each other and have a predetermined interval in the first direction. The plate bodies of the first bent plate 31 and the second bent plate 32a are perpendicular to each other, so as to form the fixing region between the first bent plate 31 and the second bent plate 32a.

Figure 6:
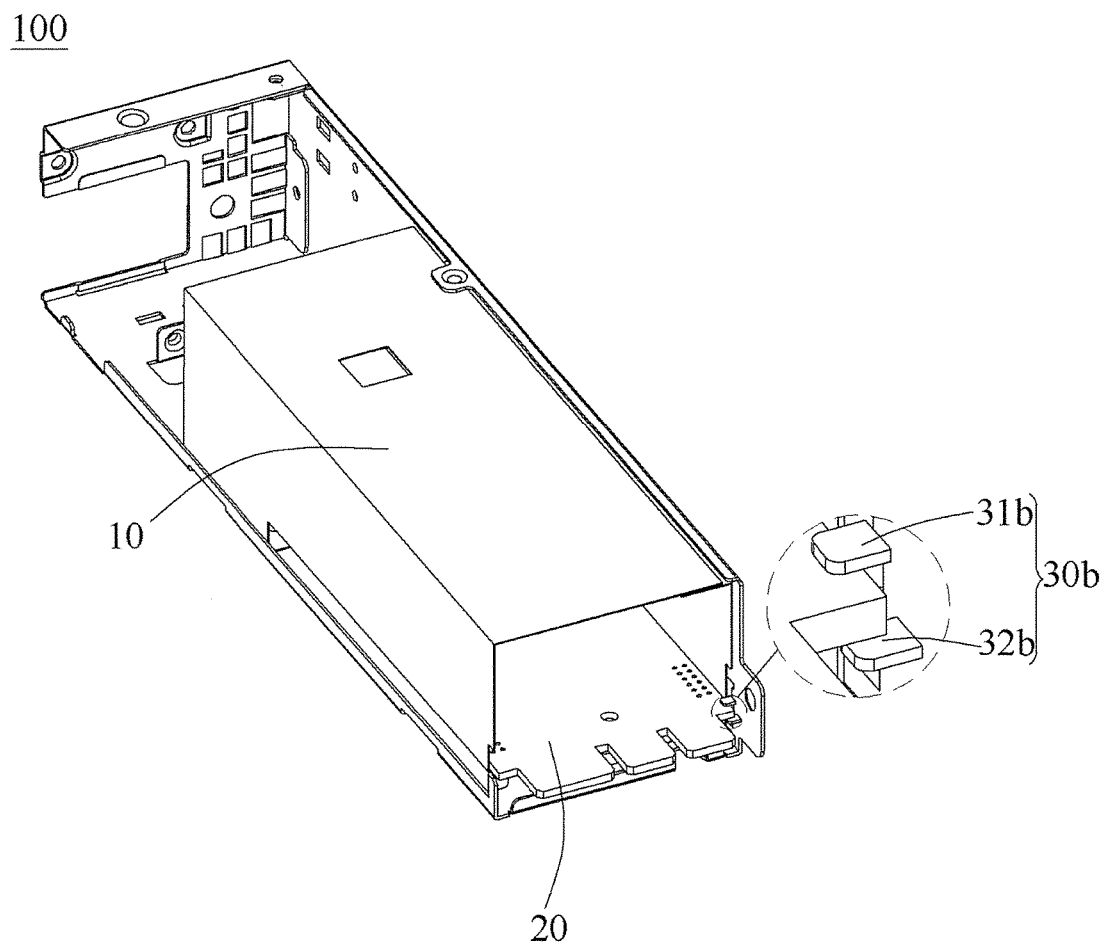
FIG. 6 is a view of the connection structure between the case and the circuit board in the third embodiment of the invention.
Figure 7:
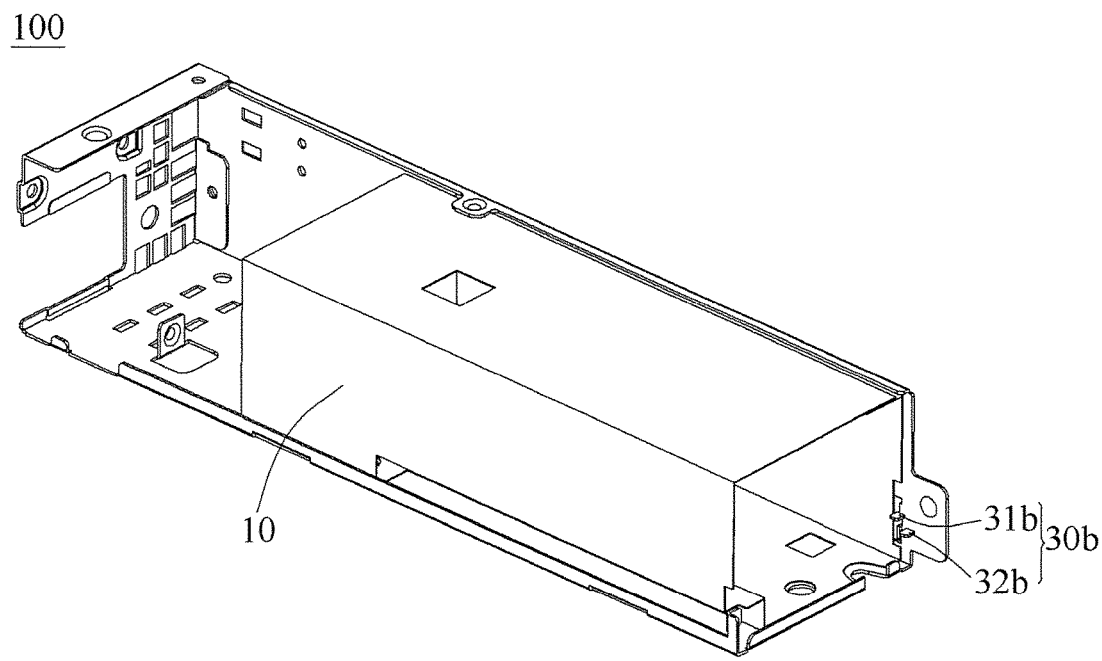
FIG. 7 is a view of the connection structure between the case and the circuit board from another perspective in the third embodiment of the invention.
Figure 8:
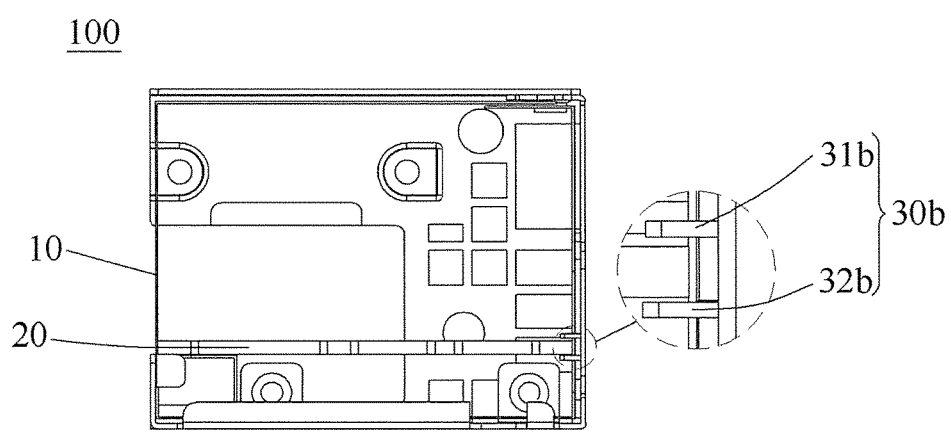
FIG. 8 is a view of the structure of the case in the third embodiment of the invention.

Referring to FIG. 6 to FIG. 8, which illustrate the third embodiment of the invention, a difference between the third embodiment and the first embodiment is that, in the third embodiment, an edge-bent component 30b includes a first bent plate 31b and a second bent plate 32b. The first bent plate 31b and the second bent plate 32b are arranged at a predetermined interval in the first direction, and the first bent plate 31b and the second bent plate 32b are misaligned in the second direction that is perpendicular to the first direction, so as to form the fixing region between the first bent plate 31b and the second bent plate 32b.

Figure 9:
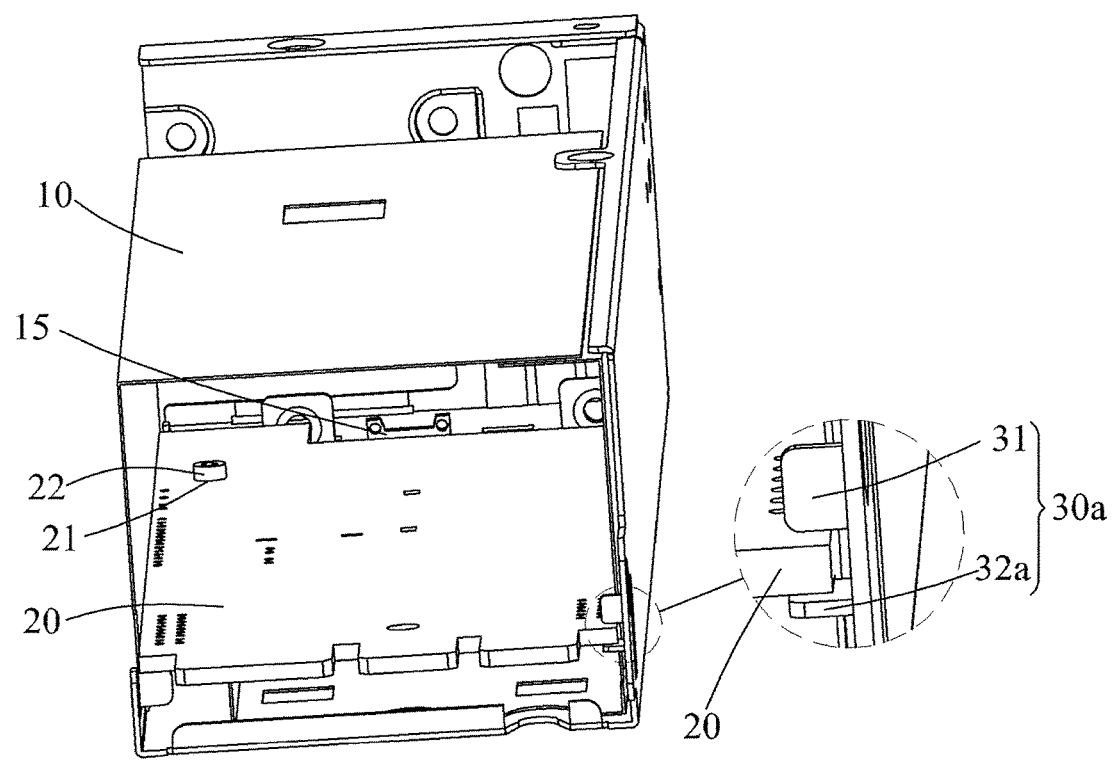
FIG. 9 is a view of the connection structure between the case and the circuit board in the fourth embodiment of the invention.

Referring to FIG. 9, which illustrates the fourth embodiment of the invention, a difference between the fourth embodiment and the above embodiments is that, in the fourth embodiment, a stopper piece 15 is disposed on the lower plate body 12 to divide the plate body 10 into two parts along the second direction. The stopper piece 15 is formed by extending and bending the lower plate body 12 inward, and the second direction is perpendicular to the first direction. In this embodiment, movement of the circuit board 20 in the second direction is blocked by the stopper piece 15, such that the circuit board 20 is fixed in a rear half part of the plate body 10 while a fan and an auxiliary circuit board are disposed in a front half part of the plate body. Of course, the fan may be used to directly divide the plate body 10 into two parts.

Three-dimensional coordinate axes are established on the case 100, wherein an X axis, a Y axis, and a Z axis are perpendicular to one another. In the above embodiments, the first direction is the Z axis direction and the second direction is the Y axis direction. Of course, the first direction and the second direction may also be other directions of the case 100 and are not limited to the directions of the X axis, Y axis, and Z axis.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A case for fixing a circuit board, comprising:
A plate body and an edge-bent component, wherein the edge-bent component comprises a first bent plate and a second bent plate that are respectively formed by extending and bending at least one of a first side plate of the plate body inward or the second side plate of the plate body inward, and a fixing region that fits a thickness of the circuit board and fixes the circuit board in a first direction is formed between the first bent plate and the second bent plate,
wherein the edge-bent component is disposed at a corner of the plate body, and a screw hole for fixing the circuit board is formed at a position on the plate body that is diagonal to the edge-bent component;
wherein the plate body comprises an upper plate body, a lower plate body, the first side plate, and the second side plate, wherein the first side plate and the second side plate are opposite to each other, a stopper piece is disposed on the lower plate body, and is formed by extending and bending the lower plate body inward so as to divide the case into a front part and a rear part.

2. The case for fixing the circuit board according to claim 1, wherein the first bent plate and the second bent plate have a predetermined interval in the first direction so as to form the fixing region between the first bent plate and the second bent plate.

3. The case for fixing the circuit board according to claim 2, wherein the first bent plate and the second bent plate are arranged opposite to each other at the predetermined interval in the first direction.

4. The case for fixing the circuit board according to claim 3, wherein a lateral side of the first bent plate and a lateral side of the second bent plate face each other, or a plate body of the first bent plate and a plate body of the second bent plate face each other or are perpendicular to each other.

5. The case for fixing the circuit board according to claim 2, wherein the first bent plate and the second bent plate are misaligned in a second direction perpendicular to the first direction.

6. The case for fixing the circuit board according to claim 2, wherein the predetermined interval between the first bent plate and the second bent plate in the first direction is slightly larger than the thickness of the circuit board so as to loosely dispose the circuit board in the fixing region.

7. A power supply, comprising a case, a circuit board mounted in the case, and a circuit component mounted on the circuit board, wherein the case is the case for fixing the circuit board comprising:
a plate body and an edge-bent component, wherein the edge-bent component comprises a first bent plate and a second bent plate that are respectively formed by extending and bending at least one of a first side plate of the plate body inward or a second side plate of the plate body inward, and a fixing region that fits a thickness of the circuit board and fixes the circuit board in a first direction is formed between the first bent plate and the second bent plate, and the circuit board is mounted in the fixing region to restrict movement of the circuit board in the first direction,
wherein the edge-bent component is disposed at a corner of the plate body, and a screw hole for fixing the circuit board is formed at a position on the plate body that is diagonal to the edge-bent component;
wherein the plate body comprises an upper plate body, a lower plate body, the first side plate, and the second side plate, wherein the first side plate and the second side plate are opposite to each other, a stopper piece is disposed on the lower plate body, and is formed by extending and bending the lower plate body inward so as to divide the case into a front part and a rear part.

8. The power supply according to claim 7, wherein the first bent plate and the second bent plate have a predetermined interval in the first direction so as to form the fixing region between the first bent plate and the second bent plate.

9. The power supply according to claim 8, wherein the first bent plate and the second bent plate are arranged opposite to each other at the predetermined interval in the first direction.

10. The power supply according to claim 9, wherein a lateral side of the first bent plate and a lateral side of the second bent plate face each other, or a plate body of the first bent plate and a plate body of the second bent plate face each other or are perpendicular to each other.

11. The power supply according to claim 8, wherein the first bent plate and the second bent plate are misaligned in a second direction perpendicular to the first direction.

12. The power supply according to claim 8, wherein the predetermined interval between the first bent plate and the second bent plate in the first direction is slightly larger than the thickness of the circuit board so as to loosely dispose the circuit board in the fixing region.

* * * * *